United States Patent
Sakai et al.

(10) Patent No.: US 12,492,488 B2
(45) Date of Patent: Dec. 9, 2025

(54) SILICON CARBIDE EPITAXIAL GROWTH DEVICE AND METHOD OF MANUFACTURING SILICON CARBIDE EPITAXIAL WAFER

(71) Applicant: Mitsubishi Electric Corporation, Tokyo (JP)

(72) Inventors: Masashi Sakai, Tokyo (JP); Shinichiro Katsuki, Tokyo (JP); Kazuo Kobayashi, Tokyo (JP); Yasunari Hino, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 559 days.

(21) Appl. No.: 16/861,885

(22) Filed: Apr. 29, 2020

(65) Prior Publication Data

US 2021/0010158 A1    Jan. 14, 2021

(30) Foreign Application Priority Data

Jul. 12, 2019    (JP) ................................ 2019-129923

(51) Int. Cl.
*C30B 25/12* (2006.01)
*C23C 16/32* (2006.01)
(Continued)

(52) U.S. Cl.
CPC ............ *C30B 25/12* (2013.01); *C23C 16/325* (2013.01); *C23C 16/4584* (2013.01);
(Continued)

(58) Field of Classification Search
CPC ....... C30B 25/12; C30B 25/10; C23C 16/325; C23C 16/4584; C23C 16/46
See application file for complete search history.

(56) References Cited

U.S. PATENT DOCUMENTS 6,740,167 B1    5/2004 Rupp et al.
2005/0022746 A1*  2/2005 Lampe .............. H01L 21/68735
                                                118/728
(Continued)

FOREIGN PATENT DOCUMENTS

CN    109896515 A    6/2019
JP    2015-122443 A    7/2015
(Continued)

OTHER PUBLICATIONS

An Office Action mailed by China National Intellectual Property Administration on Dec. 24, 2021, which corresponds to Chinese Patent Application No. 202010646344.5 and is related to U.S. Appl. No. 16/861,885; with English language translation.

(Continued)

*Primary Examiner* — Robert M Kunemund
(74) *Attorney, Agent, or Firm* — Studebaker Brackett PLLC

(57) ABSTRACT

Provided are a silicon carbide epitaxial growth device capable of fostering epitaxial growth on a silicon carbide substrate. Mounting a wafer holder loaded with a silicon carbide substrate and a tantalum carbide member to a turntable in a susceptor, and supplying a growth gas, a doping gas, and a carrier gas into the susceptor by heating by induction heating coils placed around the susceptor, thereby epitaxial growth is fostered, and stable and proper device characteristics are obtained, moreover, the yield in a manufacturing step of the silicon carbide epitaxial wafer is significantly improved.

7 Claims, 6 Drawing Sheets

(51) Int. Cl.
  *C23C 16/458* (2006.01)
  *C23C 16/46* (2006.01)
  *C30B 25/10* (2006.01)
  *C30B 29/36* (2006.01)
  *H01L 21/02* (2006.01)
  *H01L 21/67* (2006.01)
  *H01L 21/687* (2006.01)

(52) U.S. Cl.
  CPC .............. *C23C 16/46* (2013.01); *C30B 25/10* (2013.01); *C30B 29/36* (2013.01); *H01L 21/02378* (2013.01); *H01L 21/02529* (2013.01); *H01L 21/0262* (2013.01); *H01L 21/02634* (2013.01); *H01L 21/67103* (2013.01); *H01L 21/68757* (2013.01); *H01L 21/68785* (2013.01)

(56) References Cited

U.S. PATENT DOCUMENTS

| | | | |
|---|---|---|---|
| 2015/0047559 A1* | 2/2015 | Kim | C23C 28/04 118/500 |
| 2016/0312381 A1 | 10/2016 | Norimatsu et al. | |
| 2017/0032992 A1* | 2/2017 | Hoechbauer | H01L 21/68771 |
| 2017/0162425 A1 | 6/2017 | Shinohara et al. | |
| 2019/0169768 A1 | 6/2019 | Mori et al. | |
| 2021/0140067 A1 | 5/2021 | Mori et al. | |

FOREIGN PATENT DOCUMENTS

| | | |
|---|---|---|
| JP | 2016-008319 A | 1/2016 |
| JP | 2018-190813 A | 11/2018 |
| JP | 2019-091750 A | 6/2019 |

OTHER PUBLICATIONS

Office Action issued in DE 10 2020 117 128.5; mailed by the German Patent and Trade Mark Office on Jun. 30, 2022.

An Office Action; "Notice of Reasons for Refusal", mailed by the Japanese Patent Office on Jun. 21, 2022, which corresponds to Japanese Patent Application No. 2019-129923 and is related to U.S. Appl. No. 16/861,885; with English language translation.

An Office Action mailed by China National Intellectual Property Administration on Jun. 17, 2022, which corresponds to Chinese Patent Application No. 202010646344.5 and is related to U.S. Appl. No. 16/861,885; with English language translation.

\* cited by examiner

SILICON CARBIDE EPITAXIAL GROWTH DEVICE AND METHOD OF MANUFACTURING SILICON CARBIDE EPITAXIAL WAFER

BACKGROUND OF THE INVENTION

Field of the Invention

The present invention relates to a silicon carbide epitaxial growth device and a method of manufacturing a silicon carbide epitaxial wafer.

Description of the Background Art

A semiconductor device using silicon carbide significantly reduces power loss, reduces in size of the semiconductor device, and achieves energy saving during power conversion. Therefore, attention has been paid to a semiconductor device that is useful for realizing a low-carbon society in terms of improving the performance of railways and electric vehicles, or improving the functions of solar cell systems and the like.

In order to manufacture a semiconductor using silicon carbide, a film whose carrier density is highly precisely controlled is deposited on a silicon carbide substrate by the thermal chemical vapor deposition method (CVD method) or the like with the use of a silicon carbide epitaxial growth device. At this time, the silicon carbide substrate is heated to a high temperature of about 1500° C. or higher. The epitaxial growth layer is to be made into n-type, for example, by using nitrogen as doping in addition to the supplied growth gas.

Conventionally, when epitaxially growth is fostered on a silicon carbide substrate, manufacturing thereof is performed using a susceptor for arranging a wafer which is a silicon carbide substrate. The susceptor is formed from a carbon material, and the surface layer of the susceptor is a silicon carbide layer, and a tantalum carbide layer is formed in the concave portion where the wafer is placed (Japanese Patent Application Laid-Open No. 2016-008319).

When epitaxially growing is fostered on a silicon carbide substrate using a susceptor on which such a silicon carbide substrate is mounted, in plane of epitaxial film deposition on the silicon carbide substrate, carrier density of the epitaxial growth layer in the vicinity of peripheral edge portion of susceptor, or, on the outer peripheral side of the silicon carbide substrate tends to increase, instead of even carrier density. That is, when an even carrier density cannot be obtained, proper device characteristics cannot be obtained, and this has affected the yield.

SUMMARY

Accordingly, the present invention has been made in view of the above problem, and to provide a technique capable of fostering epitaxial growth so that an even carrier density is obtained on a silicon carbide substrate.

The silicon carbide epitaxial growth device according to the present invention includes a wafer holder on which a silicon carbide substrate is mounted, a turntable on which the wafer holder is mounted, a susceptor covering the silicon carbide substrate and the wafer holder, and into which a growth gas, a doping gas, and a carrier gas are supplied, induction heating coils provided around the susceptor, and a tantalum carbide member mounted on a peripheral edge portion in an upper portion of the wafer holder and outside of the silicon carbide substrate.

Epitaxial growth is fostered so that an even carrier density is obtained on a silicon carbide substrate.

These and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
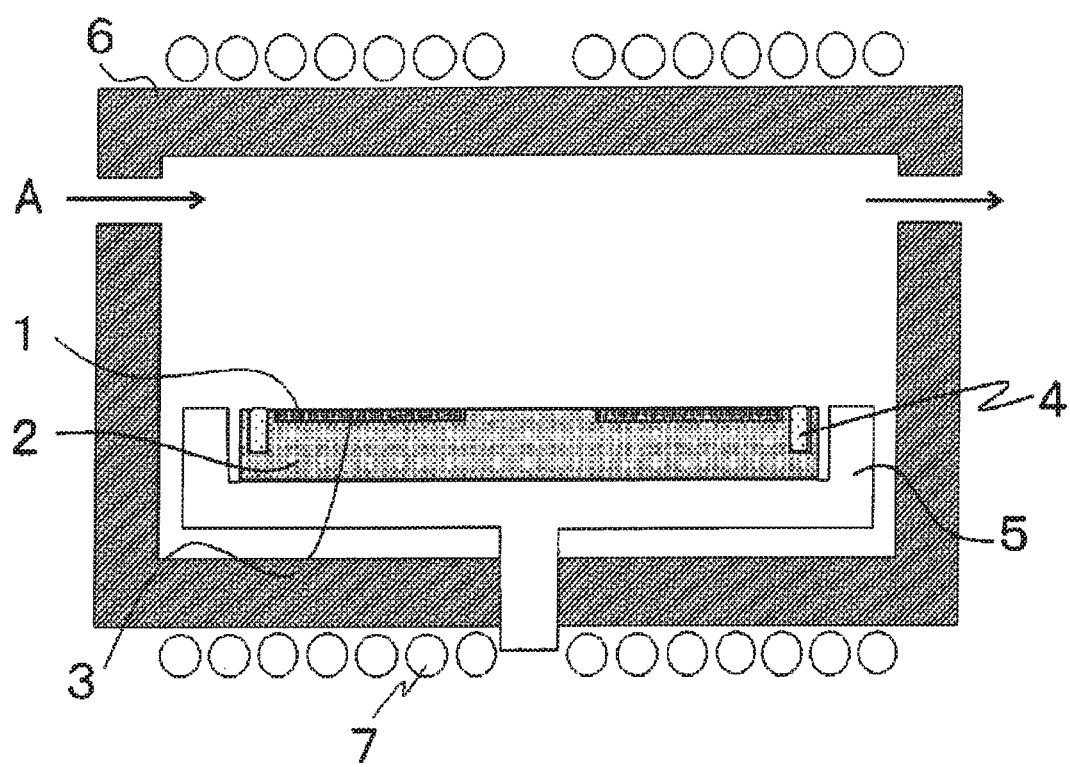
FIG. 1 is a cross-sectional view illustrating a main part of a silicon carbide epitaxial growth device according to Embodiments 1 and 2.
Figure 2:
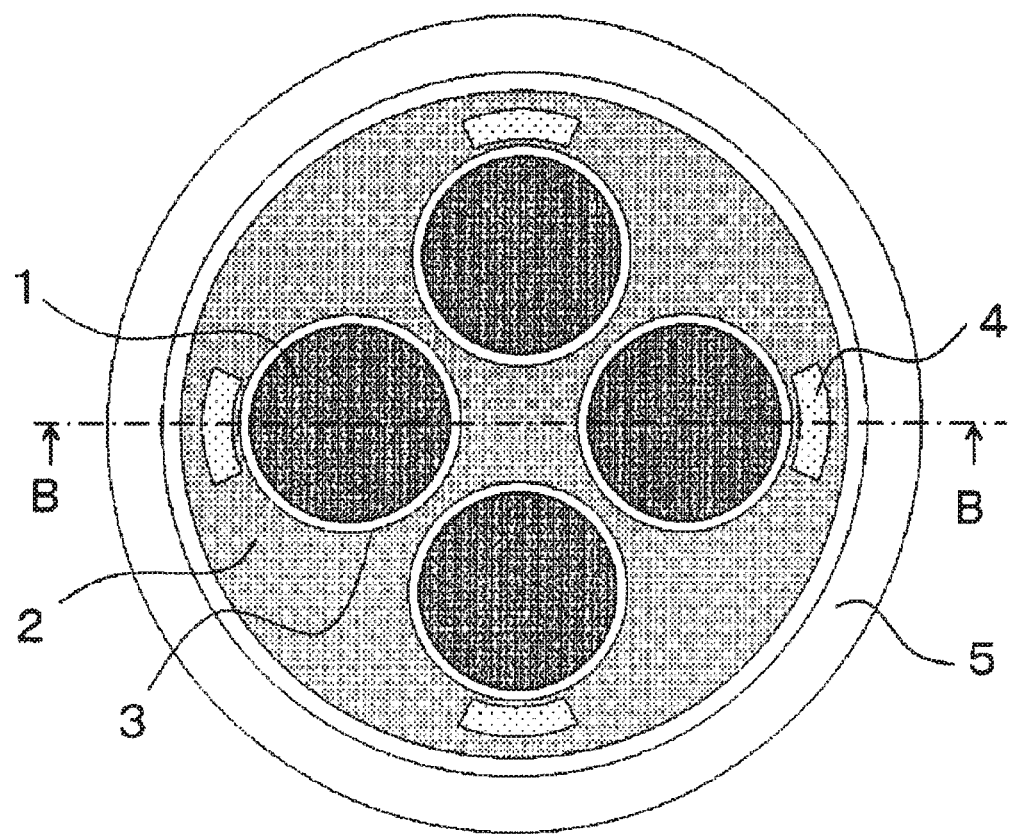
FIG. 2 is a top view of a wafer holder in the silicon carbide epitaxial growth device according to Embodiment 1.

A silicon carbide epitaxial growth device according to Embodiment 1 will be described. FIG. 1 is a cross-sectional view illustrating a main part of a silicon carbide epitaxial growth device according to Embodiment 1. FIG. 2 is a top view of a wafer holder 2 in the silicon carbide epitaxial growth device according to Embodiment 1. Regarding the relationship between FIG. 1 and FIG. 2, a cross section taken along the line B-B corresponding to the diameter in the top view illustrated in FIG. 2 corresponds to FIG. 1, and the wafer holder 2 is mounted in the susceptor 6 of the silicon carbide epitaxial growth device.

As illustrated in FIG. 1, the silicon carbide epitaxial growth device includes the wafer holder 2 on which a silicon carbide substrate 1 is mounted, a turntable 5 on which the wafer holder 2 is mounted, a susceptor 6 covering the wafer holder 2 and the turntable 5 like a chamber, and induction heating coils 7. The disk-shaped wafer holder 2 is mounted on the turntable 5 and rotates at a constant speed together with the turntable 5. As illustrated in FIGS. 1 and 2, a plurality of wafer pockets 3 are formed on the front surface of wafer holder 2 by counterbore processing, and the silicon carbide substrates 1 are mounted in the wafer pockets 3. The turntable 5 and the wafer holder 2 are arranged in the susceptor 6 and are induction-heated together with susceptor 6, the turntable 5 and the wafer holder 2 by the induction heating coils 7 placed around susceptor 6, to heat the silicon carbide substrates 1 to a predetermined temperature.

The susceptor 6 is supplied with the growth gas. An arrow A illustrated in FIG. 1 indicates flows of the growth gas, the doping gas, and the carrier gas. As the growth gas, the $SiH_4$ gas (silane gas) containing silicon atoms and the $C_3H_8$ gas (propane gas) containing carbon atoms are adoptable. The carrier gas containing hydrogen can be used. The temperature of the silicon carbide substrate 1 is, for example, 1500° C. or higher and 1700° C. or lower and the pressure in the susceptor 6 is, for example, $5 \times 10^3$ Pa or higher and $1 \times 10^4$ Pa or lower. If necessary, the nitrogen gas for n-type impurity doping is supplied simultaneously with the growth gas. An organometallic material containing Al, B, or Be for p-type impurity doping may also be supplied. Further, HCl can be used in addition to the $SiH_4$ gas, or $SiH_2Cl_2$ (dichlorosilane) can be used as an alternative of the $SiH_4$ gas, in order to increase the growth rate. Accordingly, the silicon carbide substrate 1 can be epitaxially grown by a thermal chemical vapor deposition method (CVD method) or the like.

The silicon carbide substrate 1 has a thickness of about 0.1 to 0.5 mm, and has a size of any of 4, 6, and 8 inches. After the epitaxial growth layer is formed, an element region is further formed, and finally, a power semiconductor element such as a Metal-Oxide-Semiconductor Field-Effect Transistor (MOSFET) or a diode is obtained.

The wafer holder 2 has a thickness of about 3 mm, the turntable 5 on which the wafer holder 2 is mounted has a thickness of about 6 mm, and the susceptor 6 has a thickness of about 10 mm.

The wafer holder 2, the turntable 5, and susceptor 6 are formed from a carbon material, and the surface layer of wafer holder 2 is a silicon carbide layer (about 0.1 mm in thickness). A tantalum carbide member 4 is mounted on the peripheral edge portion of the wafer holder 2 outside each wafer pocket 3. The tantalum carbide member 4 has a vertical width of about 5 to 15 mm, a horizontal width of about 10 to 40 mm, a thickness of about 0.2 to 2 mm, and is formed from a carbon material, and the surface layer thereof is a tantalum carbide layer (about 0.02 to 0.06 mm in thickness).

The reason why the material of the wafer holder 2, the turntable 5 and the susceptor 6 is carbon and the surface layers thereof are formed from a silicon carbide layer is that, when forming an epitaxial growth layer on the silicon carbide substrate 1, the silicon carbide substrate 1 needs to be heated to about 1500° C. or higher, and they are necessary to have resistance to the heat. If the surface layers of the wafer holder 2, the turntable 5, and the susceptor 6 have no silicon carbide layer, that is, only the carbon material, the carbon material may generate dust during the formation of the epitaxial growth layer. When the particles of the carbon material that have been dusted adhere to the silicon carbide substrate 1 and the epitaxial growth layer is formed with the particles adhered, the crystal grows abnormally starting from the place where the particles of the carbon material have adhered, and crystal defects are found in the epitaxial growth layer. Therefore, it is necessary to cover with silicon carbide.

When forming an epitaxial growth layer on the silicon carbide substrate 1, it is desirable that the carrier density of the epitaxial growth layer be even in plane of the epitaxial growth layer in order to obtain proper device characteristics. If the carrier density of the epitaxial growth layer is excessively higher than the desired carrier density, the breakdown voltage decreases as the resistance value decreases, resulting in a decrease in yield. Conversely, if the carrier density is excessively lower than the desired carrier density, the resistance value increases, resulting in a decrease in yield.

However, when the epitaxial growth layer is formed on the silicon carbide substrate 1, the ambient temperature of the wafer holder 2 is lower than the temperature of the central portion of the wafer holder 2, so that the amount of nitrogen incorporated into the deposits that react with the growth gas and adhere increases in the peripheral edge portion of the wafer holder 2 covered with silicon carbide. As a result, nitrogen is released from the deposits on the peripheral edge portion of the wafer holder 2 and the released amount increases, so that the carrier density on the outer peripheral side of silicon carbide substrate 1 in the vicinity thereof increases.

Meanwhile, the tantalum carbide member 4 does not contain much nitrogen because the reaction with the growth gas is small and the adhesion of the deposit is suppressed. By mounting the tantalum carbide member 4 at the peripheral edge portion of the wafer holder 2 on the outside the silicon carbide substrates 1, the influence of nitrogen is suppressed on the outer peripheral side of the silicon carbide substrate 1, so that the even carrier density in plane of epitaxial film deposition on the silicon carbide substrate 1 is obtained. And, desired proper device characteristics can be obtained.

As illustrated in FIGS. 1 and 2, there are four concave portions on the wafer holder 2, and a tantalum carbide member 4 is mounted on each concave portion. Each concave portion is located at the peripheral edge portion of wafer holder 2 and outside each silicon carbide substrate 1. As illustrated in FIG. 2, there are four wafer pockets 3 on the wafer holder 2; therefore, the silicon carbide substrate 1 is to be mounted at each of the four locations, accordingly the tantalum carbide member 4 is also to be mounted at each of the four locations. As described above, the number of mountable tantalum carbide members 4 corresponds to the number of silicon carbide substrates 1 to be mounted on the wafer holder 2.

By mounting the tantalum carbide members 4 at the concave portions on the wafer holder 2, the exposed upper surface of the wafer holder 2, the upper surfaces of the silicon carbide substrates 1, and the upper surfaces of the tantalum carbide members 4 are flush with each other, as illustrated in FIG. 1.

The tantalum carbide member 4 is replaceable. The tantalum carbide member 4 hardly reacts with the growth gas as compared with a member coated with silicon carbide (for example, the wafer holder 2), so that the amount of deposits is highly small.

However, in order to form an epitaxial growth layer on the silicon carbide substrate 1, a process time of about 1 to 8 hours is required, and when the tantalum carbide member 4 is used many times to form the epitaxial growth layer, deposits may adhere to the tantalum carbide member 4. In that case, an epitaxial growth layer is formed on the silicon carbide substrate 1 by replacing with a new tantalum carbide member 4 to which no deposit is adhered, and mounting the tantalum carbide member 4 on the wafer holder 2. The used tantalum carbide member 4 that has been replaced can be reused by removing adhered deposits by polishing or etching. As described above, in the silicon carbide epitaxial growth device, epitaxial growth can be always fostered so as to have an even carrier density on the silicon carbide substrate 1, and as a result, proper device characteristics can be obtained. Further, the productivity is stabilized, and the yield can be significantly improved.

The tantalum carbide member 4 is not limited to the shape as illustrated in FIG. 2. Similarly, a replaceable fan shape, triangular shape, or square shape may also be adoptable. In view of polishing or etching, any shape except intricate shapes is adoptable.

As described above, in the silicon carbide epitaxial growth device according to the present invention, the amount of nitrogen supplied on the outer peripheral side of the silicon carbide substrate 1 in the vicinity of the peripheral edge portion of the wafer holder 2 is reduced by the tantalum carbide member 4 by mounting the tantalum carbide member 4 at the peripheral edge portion in an upper portion of the wafer holder 2 mounted on the turntable 5 and on the outer peripheral side of the silicon carbide substrates 1, being heated by the induction heating coils 7 placed around the susceptor 6, and supplying the growth gas or the like into the susceptor 6, thereby increasing the carrier density in the epitaxial growth layer on the outer peripheral side of silicon carbide substrate 1 is suppressed. Accordingly, the silicon carbide epitaxial growth device of the present invention is capable of fostering epitaxial growth so that an even carrier density is obtained on a silicon carbide substrate 1.

In addition, the carrier density of the epitaxial growth layer becomes even; therefore, stable and proper device characteristics can be obtained. Further, the above configuration can significantly improve the yield as a silicon carbide epitaxial growth device.

Figure 3:
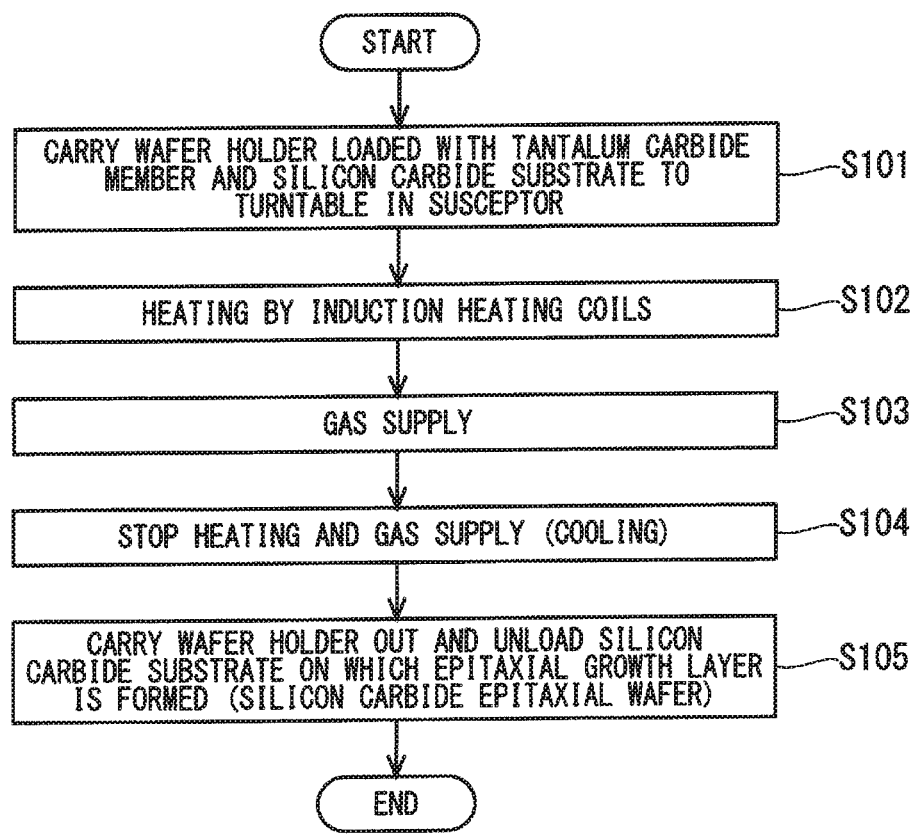
FIG. 3 is a flowchart illustrating a method of manufacturing a silicon carbide epitaxial wafer according to Embodiment 1.

Next, a method of manufacturing the silicon carbide epitaxial wafer according to Embodiment 1 of the present invention will be described referring to a flowchart illustrated in FIG. 3. In order to form an epitaxial growth layer on silicon carbide substrate 1 using the silicon carbide epitaxial growth device, the tantalum carbide member 4 is mounted on (loaded with) the wafer holder 2 and the silicon carbide substrate 1 is mounted on the wafer pocket 3. Then, a transfer mechanism (not shown) places the wafer holder 2 on which the tantalum carbide member 4 and the silicon carbide substrate 1 are mounted on the turntable 5 provided in the susceptor 6 (S101).

Next, the inside of the susceptor 6 is evacuated to a reduced pressure. Then, power is supplied to the induction heating coils 7 placed around the susceptor 6. By supplying power to the induction heating coils 7, the susceptor 6, the turntable 5, and the wafer holder 2 are inductively heated. When the susceptor 6, the turntable 5 and the wafer holder 2 are inductively heated, the silicon carbide substrate 1 is heated by radiant heat from the inner wall and the like of the susceptor 6, and heat conduction from the turntable 5 and the wafer holder 2 (S102). When the temperature of silicon carbide substrate 1 reaches a desired temperature, the growth gas, the doping gas and the carrier gas are supplied into the susceptor 6 (S103). In order to form the epitaxial growth layer on the silicon carbide substrate 1, the growth gas or the like supplied into the susceptor 6 needs to be decomposed on the silicon carbide substrate 1; therefore, the silicon carbide substrate 1 is heated to about 1500° C. to 1700° C. in Embodiment 1.

As the growth gas, the $SiH_4$ gas, the $C_3H_8$ gas, the nitrogen gas as n-type impurity doping, and hydrogen as carrier gas are supplied. As indicated by the arrow A in FIG. 1, the susceptor 6 has a structure in which the growth gas is supplied and exhausted at the same time, so that the susceptor 6 is always filled with a new gas. Note that a structure in which gas flows from the upper part to the lower part of the susceptor 6 illustrated in FIG. 1 may also be adopted.

In Embodiment 1, the silicon carbide substrate 1 is heated to about 1500° C. to 1700° C.; therefore, the growth gas supplied into susceptor 6 is decomposed on the silicon carbide substrate 1. Then, the epitaxial growth layer can be formed on the silicon carbide substrate 1. When the epitaxial growth layer is formed to a desired thickness, the supply of the growth gas into the susceptor 6 is stopped, and the power supply to the induction heating coils 7 is also stopped (S104). Thereafter, the wafer holder 2 is carried out of the susceptor 6 from the turntable 5, and the silicon carbide substrate 1 on which the epitaxial growth layer is formed is unloaded from the wafer pocket 3 (S105).

The silicon carbide substrate 1 on which the epitaxial growth layer is formed is referred to as a silicon carbide epitaxial wafer in Embodiment 1. The method of forming the epitaxial growth layer on the silicon carbide substrate 1 using the silicon carbide epitaxial growth device according to Embodiment 1 of the present invention described above is a method of manufacturing a silicon carbide epitaxial wafer.

As described above, the method of manufacturing the silicon carbide epitaxial wafer according to the present invention includes a carrying-in step (S101) in which a transfer mechanism (not shown) carries the wafer holder 2 loaded with the silicon carbide substrate 1 and the tantalum carbide member 4 to the turntable 5 in the susceptor 6; a heating step (S102) in which the induction heating coils 7 heat the silicon carbide substrate 1, the wafer holder 2, the turntable 5, and the susceptor 6; a gas supply step (S103) of supplying a growth gas, a doping gas and a carrier gas into the susceptor 6; a cooling step (S104) of stopping heating and gas supply; and a carrying-out step (S105) in which the transfer mechanism (not shown) carries the wafer holder 2 loaded with the silicon carbide substrate 1 and the tantalum carbide member 4 out of the susceptor 6 from the turntable 5, and unloads the silicon carbide substrate 1 on which the epitaxial growth layer is formed from the wafer pocket 3.

According to the above manufacturing method, epitaxial growth can be fostered on silicon carbide substrate 1 so as to have an even carrier density, therefore, stable and proper device characteristics can be obtained. Further, the manufacturing yield of the silicon carbide epitaxial wafer is significantly improved.

As described above, in the silicon carbide epitaxial growth device according to Embodiment 1, the amount of nitrogen supplied on the outer peripheral side of the silicon carbide substrate 1 in the vicinity of the peripheral edge portion in the upper portion of the wafer holder 2 is reduced by the tantalum carbide member 4 by mounting the turntable 5 after mounting the tantalum carbide member 4 on the outer peripheral side of silicon carbide substrate 1 which is at the peripheral edge portion of the wafer holder 2, being heated by the induction heating coils 7 placed around the susceptor 6, and supplying the growth gas, the doping gas and the carrier gas into the susceptor 6, thereby the carrier density in the epitaxial growth layer is suppressed from increasing on the outer peripheral side of silicon carbide substrate 1. With the above configuration, when an epitaxial growth layer is formed on the silicon carbide substrate 1, the carrier density of the silicon carbide epitaxial wafer becomes even; therefore, stable and proper device characteristics can be obtained. Further, the yield is significantly improved in the process of manufacturing of epitaxial growth.

Note that the tantalum carbide member 4 may be mounted not on the wafer holder 2 but on the outer periphery of the silicon carbide substrate 1 in the wafer pocket 3 having a larger area than the silicon carbide substrate 1. Similarly, the epitaxial growth layer of silicon carbide substrate 1 has an even carrier density; therefore, stable and proper device characteristics can be obtained.

Also in the tantalum carbide member 4, although, it is preferable that the surface layer thickness of tantalum carbide is as small as possible because the warp increases when the surface layer thickness of tantalum carbide is large, the surface thickness of the tantalum carbide member 4 can be determined based on the result obtained from the life of usage in consideration of the effect of warpage due to the size of the tantalum carbide member 4 and the wear property due to the frequency of use.

Other materials can be substituted as long as the reactivity with the growth gas is as low as that of the tantalum carbide member 4, and the same effect can be obtained. For example, a member made of silicon carbide or carbon having high crystallinity manufactured by the CVD method and having a surface polished may be used. Alternatively, a member obtained by forming a silicon carbide layer on carbon having a surface polished may also be used.

The silicon carbide substrate 1 is not limited to the silicon carbide substrate 1, a compound substrate such as GaN is also adoptable thereby the same effect can be obtained.

Embodiment 2

Figure 4:
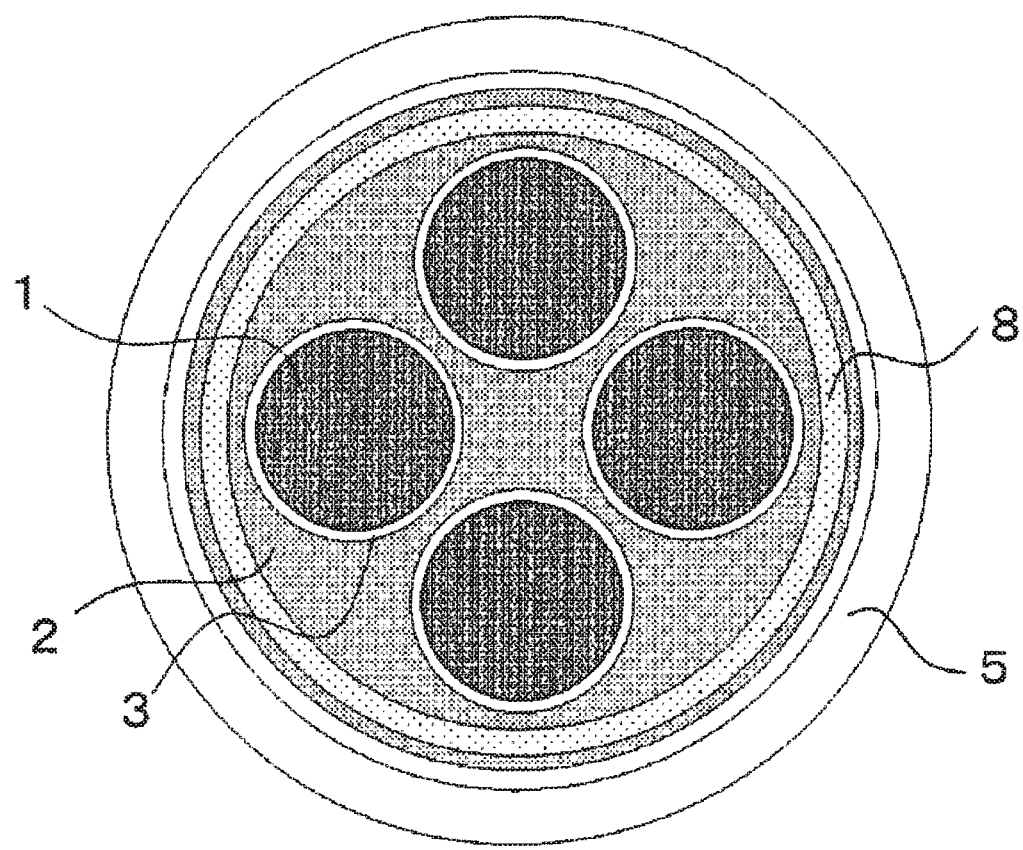
FIG. 4 is a top view of a wafer holder in the silicon carbide epitaxial growth device according to Embodiment 2.

FIG. 4 is a top view of a wafer holder in the silicon carbide epitaxial growth device according to Embodiment 2. In a silicon carbide epitaxial growth device according to Embodiment 2, many configurations thereof are common to those of Embodiment 1. Therefore, points that differ from the silicon carbide epitaxial growth device in Embodiment 1 will be described, and the same or corresponding components will be denoted by the same reference numerals and description thereof will be omitted. Embodiment 2 differs from Embodiment 1 in configuration in which one tantalum carbide member 8 is provided on the peripheral edge portion of the wafer holder 2, and outside silicon carbide substrate 1.

The tantalum carbide member 8 has an annular shape as illustrated in FIG. 4, and has a width of about 5 to 20 mm and a thickness of about 0.2 to 2 mm. The tantalum carbide member 8 is formed from a carbon material, and the surface layer thereof is a tantalum carbide layer (about 0.02 to 0.06 mm in thickness).

The tantalum carbide member 8 is mounted on one position on the outside of silicon carbide substrate 1, and the peripheral edge portion in the upper portion of the wafer holder 2. For example, as illustrated in FIG. 4, the wafer holder 2 has four wafer pockets 3 so that the silicon carbide substrates 1 are mounted at four places, while the tantalum carbide member 8 is provided only at one place.

The cross-sectional view illustrating the main part of the silicon carbide epitaxial growth device according to Embodiment 2 is the same as that illustrated in FIG. 1. The difference from Embodiment 1 is that the tantalum carbide member 4 is replaced with the tantalum carbide member 8.

As described above, when the epitaxial growth layer is formed on the silicon carbide substrate 1, only one the tantalum carbide member 8 is mounted along the outward shape of the wafer holder 2 regardless of the size of the silicon carbide substrate 1 and the number of the silicon carbide substrates 1 mounted on the wafer holder 2. The number of tantalum carbide members 8 mounted can be significantly reduced with respect to the number of carbide substrates 1 mounted on the wafer holder 2.

In Embodiment 2, the tantalum carbide member 8 is mounted on the wafer holder 2 at only one position irrespective of the number of mounted silicon carbide substrates 1, so that workability and productivity are excellent. In particular, when the number of the silicon carbide substrates 1 mounted on the wafer holder 2 is large, and when the operation rate of the silicon carbide epitaxial growth device is high, the effect to be exhibited is remarkable. In addition, the number of tantalum carbide members 8 to be mounted is small and the shape of the tantalum carbide member 8 is large along the outward shape of wafer holder 2; therefore, the tantalum carbide members 8 can be prevented from not being mounted, at the time of manufacturing. Further, the tantalum carbide member 8 is exchangeable similarly to that of the Embodiment 1, so that the tantalum carbide member 8 can be changed to a tantalum carbide member 8 to which no deposit is adhered. Accordingly, epitaxial growth can be fostered on silicon carbide substrate 1 so as to have an even carrier density, therefore, stable and proper device characteristics can be obtained.

The tantalum carbide member 8 only needs to be provided on the peripheral edge portion of the wafer holder 2 and outside of silicon carbide substrate 1, and the shape thereof is not limited to an annular shape.

Although it depends on workability and productivity, the number of tantalum carbide members 8 need not be limited to one for the wafer holder 2, a plurality of tantalum carbide members 8, for example, two may be adoptable.

The method of manufacturing the silicon carbide epitaxial water in which the epitaxial growth layer is formed on the silicon carbide substrate 1 using the above silicon carbide epitaxial growth device is as the same as that of Embodiment 1, and with the method, epitaxial growth can be fostered on silicon carbide substrate 1 so as to have an even carrier density.

Embodiment 3

Figure 5:
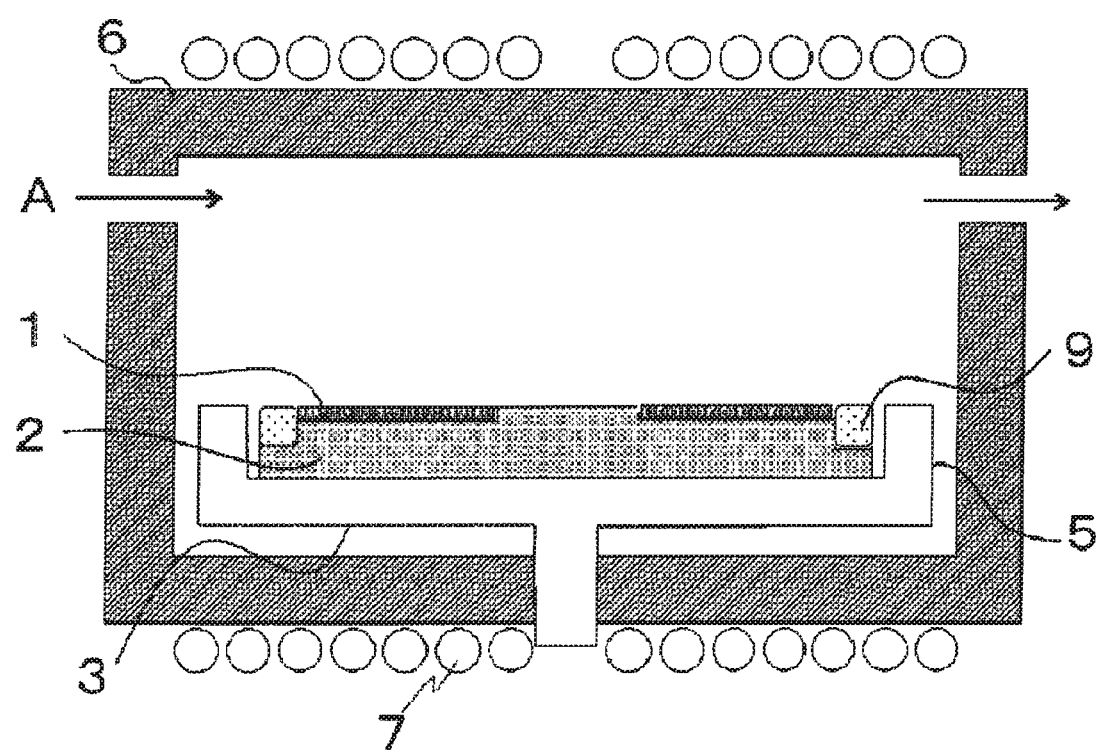
FIG. 5 is a cross-sectional view illustrating a main part of a silicon carbide epitaxial growth device according to Embodiment 3.
Figure 6:
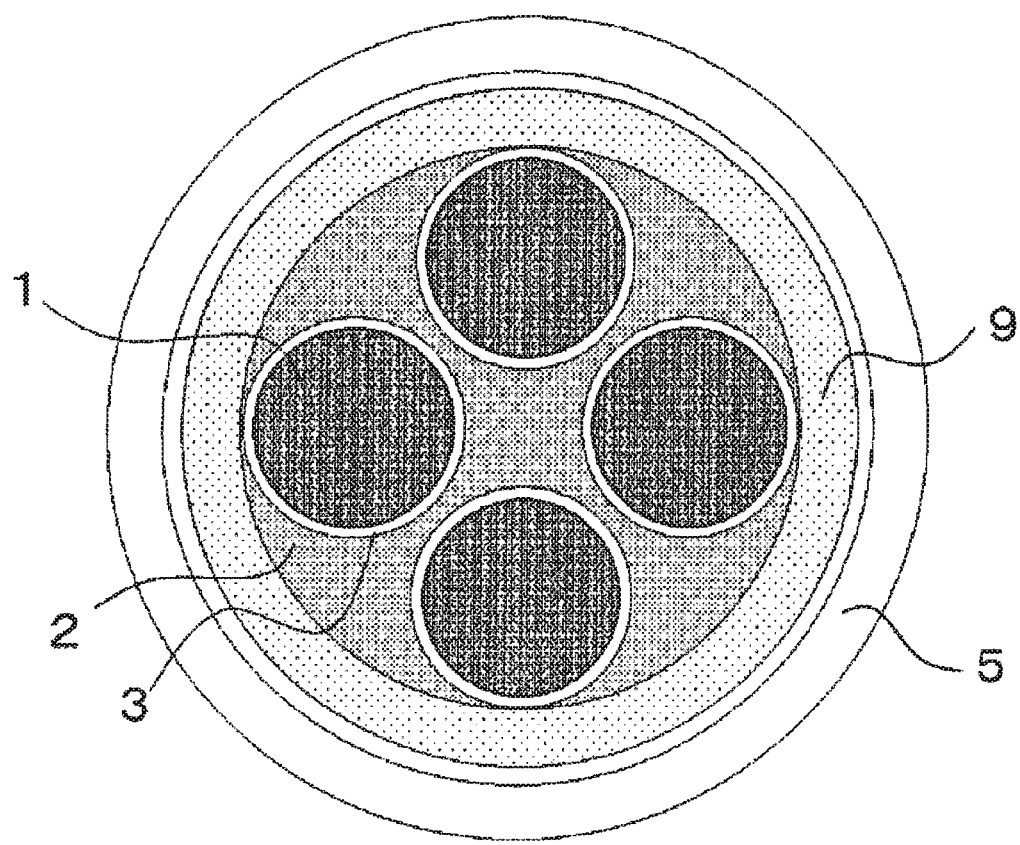
FIG. 6 is a top view of a wafer holder in the silicon carbide epitaxial growth device according to Embodiment 3.

FIG. 5 is a cross-sectional view illustrating a main part of a silicon carbide epitaxial growth device according to Embodiment 3. FIG. 6 is a top view of a wafer holder 2 in the silicon carbide epitaxial growth device according to Embodiment 3. In a silicon carbide epitaxial growth device according to Embodiment 3, many configurations thereof are common to those of Embodiment 1. Therefore, points that differ from the silicon carbide epitaxial growth device in Embodiment 1 will be described, and the same or corresponding components will be denoted by the same reference numerals and description thereof will be omitted. Embodiment 3 differs from Embodiment 1 in configuration in which the outer peripheral edge of the wafer holder 2 is concave and has a step shape, a tantalum carbide member 9 is provided at a step on the outer peripheral edge of the wafer holder 2 outside the silicon carbide substrate 1.

As illustrated in FIGS. 5 and 6, the wafer holder 2 has a step shape being a groove extending along the outer periphery thereof. The step is about 0.2 to 2 mm. The tantalum carbide member 9 having an annular shape is mounted at the step.

The tantalum carbide member 9 has an annular shape as illustrated in FIG. 6, has a width of about 5 to 20 mm and a thickness of about 0.2 to 2 mm, and is in contact with the wafer pockets 3. The tantalum carbide member 9 is formed from a carbon material, and the surface layer thereof is a tantalum carbide layer (about 0.02 to 0.06 mm in thickness).

As illustrated in FIG. 5, by mounting the tantalum carbide member 9 at the step in the outer peripheral edge of the wafer holder 2, the height of the tantalum carbide member 9 becomes equal to the upper surfaces of the silicon carbide substrates 1 and the wafer holder 2.

As described above, when the epitaxial growth layer is formed on the silicon carbide substrate 1, only one the tantalum carbide member 9 is mounted at the step in the outer peripheral edge of the wafer holder 2 regardless of the size of the silicon carbide substrate 1 and the number of the silicon carbide substrates 1 mounted on the wafer holder 2. The number of tantalum carbide members 9 mounted can be significantly reduced with respect to the number of carbide substrates 1 mounted on the wafer holder 2.

In Embodiment 3, the tantalum carbide member 9 is mounted on the wafer holder 2 at only one position irrespective of the number of mounted silicon carbide substrates 1, so that workability and productivity are excellent. In particular, when the number of the silicon carbide substrates 1 mounted on the wafer holder 2 is large, and when the operation rate of the silicon carbide epitaxial growth device is high, the effect to be exhibited is remarkable. In addition, the number of tantalum carbide members 9 to be mounted is small and the shape of the tantalum carbide member 9 is large along the outer peripheral edge of the wafer holder 2; therefore, the tantalum carbide members 9 can be prevented from not being mounted, at the time of manufacturing. Further, the tantalum carbide member 9 is exchangeable similarly to that of the Embodiment 1, so that the tantalum carbide member 9 can be changed to a tantalum carbide member 9 to which no deposit is adhered. In addition, it is extremely excellent in workability, particularly in mountability on and detachability from the wafer holder 2. Accordingly, epitaxial growth can be fostered on silicon carbide substrate 1 so as to have an even carrier density, therefore, stable and proper device characteristics can be obtained.

The tantalum carbide member 9 only needs to be mounted at the step on the outer peripheral edge of the wafer holder 2 and outside the silicon carbide substrate 1, and the shape thereof is not limited to an annular shape.

Although it depends on workability and productivity, the number of tantalum carbide members 9 need not be limited to one for the wafer holder 2, a plurality of tantalum carbide members 9, for example, two may be adoptable.

The method of manufacturing the silicon carbide epitaxial water in which the epitaxial growth layer is formed on the silicon carbide substrate 1 using the above silicon carbide epitaxial growth device is as the same as that of Embodiment 1, and with the method, epitaxial growth can be fostered on silicon carbide substrate 1 so as to have an even carrier density.

It should be noted that Embodiments of the present invention can be arbitrarily combined and can be appropriately modified or omitted without departing from the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A silicon carbide epitaxial growth device comprising:
   a wafer holder on which a silicon carbide substrate is mounted;
   a turntable on which the wafer holder is mounted;
   a susceptor covering the silicon carbide substrate and the wafer holder, and into which a growth gas, a doping gas, and a carrier gas are supplied;
   induction heating coils provided around the susceptor; and
   a tantalum carbide member mounted into the surface on a peripheral edge portion in an upper portion of the wafer holder and only at an outer edge of the silicon carbide substrate closest to an outermost periphery of the wafer holder.

2. The silicon carbide epitaxial growth device according to claim 1, wherein
   the tantalum carbide member includes a tantalum carbide layer as a surface layer thereof which is formed from a carbon material, the tantalum carbide member being replaceable.

3. The silicon carbide epitaxial growth device according to claim 1, wherein
   the tantalum carbide member has a shape extending along an outer peripheral of the wafer holder which is on outside of the silicon carbide substrate.

4. The silicon carbide epitaxial growth device according to claim 1, wherein
   the wafer holder has a step shape at a peripheral edge portion thereof and the tantalum carbide member is mounted at a step of the peripheral edge portion of the wafer holder.

5. A method of manufacturing a silicon carbide epitaxial wafer comprising:
   carrying a wafer holder loaded with a silicon carbide substrate and a tantalum carbide member mounted into the surface on a peripheral edge portion in an upper portion of the wafer holder to a turntable in a susceptor by a transfer mechanism such that the tantalum carbide member is arranged at only an outer edge of the silicon carbide substrate closest to an outermost periphery of the wafer holder;
   heating the silicon carbide substrate, the wafer holder, and the turntable by induction heating coils provided around the susceptor;
   supplying a growth gas, a doping gas and a carrier gas into the susceptor;
   cooling by stopping heating and gas supply; and
   carrying the wafer holder out of the turntable by the transfer mechanism and unloading the silicon carbide substrate.

6. The silicon carbide epitaxial growth device according to claim 1, wherein
   the portion of the surface of the wafer holder into which the tantalum carbide member is mounted is separate from the portion of the surface of the wafer holder that the silicon carbide substrate is mounted.

7. The method according to claim 5, wherein
   the portion of the surface of the wafer holder into which the tantalum carbide member is mounted is separate from the portion of the surface of the wafer holder that the silicon carbide substrate is mounted.

* * * * *